US 6,638,824 B2

(12) United States Patent
Chau et al.

(10) Patent No.: US 6,638,824 B2
(45) Date of Patent: Oct. 28, 2003

(54) METAL GATE DOUBLE DIFFUSION MOSFET WITH IMPROVED SWITCHING SPEED AND REDUCED GATE TUNNEL LEAKAGE

(75) Inventors: Duc Q. Chau, San Jose, CA (US); Brian S. Mo, Fremont, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/053,891

(22) Filed: Jan. 11, 2002

(65) Prior Publication Data

US 2002/0084486 A1 Jul. 4, 2002

Related U.S. Application Data

(62) Division of application No. 09/222,258, filed on Dec. 28, 1998.

(51) Int. Cl.[7] ............................................. H01L 21/336
(52) U.S. Cl. ...................... 438/268; 438/273; 438/204
(58) Field of Search ................................. 438/133, 268, 438/273, 284, 286, 291; 257/335, 336, 327, 328, 329, 340, 341, 342, 360, 362, 401, 412

(56) References Cited

U.S. PATENT DOCUMENTS

| 4,084,311 A | 4/1978 | Yasuoka et al. |
| 4,221,044 A | 9/1980 | Godejahn, Jr. et al. |
| 4,221,045 A | 9/1980 | Godejahn, Jr. |
| 4,264,376 A | 4/1981 | Yatsuda et al. |
| 4,277,881 A | 7/1981 | Godejahn, Jr. |
| 4,382,827 A | 5/1983 | Romano-Moran et al. |
| 4,419,809 A | 12/1983 | Riseman et al. |
| 4,424,621 A | 1/1984 | Abbas et al. |
| 4,455,737 A | 6/1984 | Godejahn, Jr. |

(List continued on next page.)

OTHER PUBLICATIONS

Ha, D. et al. "Cell Transistor Design Using Self–Aligned Local Channel Implant (SALCI) for 4GB DRAMS and Beyond," *International Conference on Solid State Devices and Materials, JA, Japan Society of Applied Physics, Tokyo*, Sep. 1, 1997, pp. 514–515, XP000728217, figure 1.

Mena, J. et al. "High Frequency Performance of VDMOS Power Transistors," *International Electron Devices Meetings. Technical Digest, Washington, D.C., USA, 8–10 Dec. 1980*, pp. 91–94, XP002148592, N.Y. USA, *IEEE*, figure 1.

Singer, P. "Metal Gates Could Replace Poly Gates for 0.1 $\mu$m Generation", Semiconductor International, Wafer Processing, Oct. 1997.

Yagishita, A. et al. "High Performance Metal Gate MOSFETS Fabricated by CMP for 0.1MUM Regime," *International Electron Devices Meeting, US, N.Y. IEEE*, Dec. 6, 1998, pp. 785–788, XP000859487 ISBN: 0–7803–4775–7.

Primary Examiner—Phat X. Cao
Assistant Examiner—Theresa T. Doan
(74) Attorney, Agent, or Firm—Townsend, Townsend & Crew LLP

(57) ABSTRACT

A double-diffused metal-oxide-semiconductor ("DMOS") field-effect transistor (10) with a metal gate (26). A sacrificial gate layer is patterned to provide a self-aligned source mask. The source regions (20) are thus aligned to the gate (26), and the source diffusion provides a slight overlap (28) for good turn-on characteristics and low leakage. The sacrificial gate layer is capable of withstanding the diffusion temperatures of the DMOS process and is selectively etchable. After the high-temperature processing is completed, the sacrificial gate layer is stripped and a metal gate layer is formed over the substrate, filling the volume left by the stripped sacrificial gate material. In one embodiment, a chemical-mechanical polishing technique is used to planarize the metal gate layer.

10 Claims, 7 Drawing Sheets

U.S. PATENT DOCUMENTS

| | | |
|---|---|---|
| 4,466,172 A | 8/1984 | Batra |
| 4,500,898 A | 2/1985 | Cline |
| 4,577,391 A | 3/1986 | Hsia et al. |
| 4,593,453 A | 6/1986 | Tam et al. |
| 4,599,789 A | 7/1986 | Gasner |
| 4,701,423 A | 10/1987 | Szluk |
| 4,760,033 A | 7/1988 | Mueller |
| 4,912,061 A | 3/1990 | Nasr |
| 4,946,799 A | 8/1990 | Blake et al. |
| 5,164,327 A | 11/1992 | Maruyama |
| 5,169,796 A | 12/1992 | Murray et al. |
| 5,273,922 A | 12/1993 | Tsoi |
| 5,304,831 A | 4/1994 | Yilmaz et al. |
| 5,399,513 A | 3/1995 | Liou et al. |
| 5,420,452 A | 5/1995 | Tran et al. |
| 5,432,105 A | 7/1995 | Chien |
| 5,472,887 A | 12/1995 | Hutter et al. |
| 5,514,608 A | 5/1996 | Williams et al. |
| 5,547,895 A | 8/1996 | Yang |
| 5,665,619 A | 9/1997 | Kwan et al. |
| 5,684,319 A | 11/1997 | Hebert |
| 5,729,037 A | 3/1998 | Hébert |
| 6,060,745 A | 5/2000 | Tadokoro et al. |
| 6,074,923 A | 6/2000 | Lee |
| 6,091,115 A | 7/2000 | Ohtani et al. |

METAL GATE DOUBLE DIFFUSION MOSFET WITH IMPROVED SWITCHING SPEED AND REDUCED GATE TUNNEL LEAKAGE

CROSS-REFERENCES TO RELATED APPLICATIONS

This is a division of application Ser. No. 09/222,258, filed on Dec. 28, 1998.

BACKGROUND OF THE INVENTION

The present invention relates to field-effect transistors, in particular trench double-diffused metal-oxide-semiconductor ("DMOS") transistors, and their method of manufacture.

DMOS transistors are a type of field-effect transistor ("FET") that can be used as a power transistor, that is, a transistor that is used to switch or control relatively large amounts of electrical power compared to a transistor that might be used in a logic circuit application. Power transistors might operate between 5–30 volts, or higher, and might carry over several tenths of an amp to several amps of current. Power MOS FETs are designed to operate under conditions that would destroy conventional MOS FETs, or at least accelerate their failure. One design feature that can be incorporated into a DMOS FET to provide high-power handling capability is to increase the width of the gate of the FET. Using conventional terminology, the length of the gate relates to the distance between the drain and source, and the width relates to the run of the gate.

Generally speaking, the wider the gate, the higher the power-handling capability of the FET because the power-per-unit width of the gate is lower. However, increasing the gate width typically causes the gate on-resistance ("$R_{Gon}$") to undesirably increase. High $R_{Gon}$ can affect switching speeds in applications for power FETs, such as DC-to-DC converters.

One approach to reduce $R_{Gon}$ is to divide the gate of a single DMOS FET up into "cells", each cell having a portion of the total gate width, and each of the sections of the gate within the cells being electrically coupled to a common voltage source, such as a bus bar, that is connected to the gate pad. However, even with techniques such as a cell configuration and gate voltage distribution bus bar, it is still desirable in some instances to further reduce $R_{Gon}$. One way to accomplish this is to reduce the inherent resistivity of the material used as the gate conductor material.

Unfortunately, polysilicon, which has a relatively high resistivity, is typically used as the gate conductor material. Polysilicon is used because it can withstand the subsequent high-temperature processing of conventional DMOS device fabrication sequences, which form the channel and source regions with high-temperature diffusion processes. Many conventional MOS FETs can use materials other than polysilicon as the gate conductor because such high-temperature processing is not used in the fabrication sequence.

Accordingly, it is desirable to provide a DMOS transistor with lower $R_{Gon}$ and higher switching speed at a given operating point.

SUMMARY OF THE INVENTION

The present invention provides a DMOS transistor, including a method of manufacture, with a metal gate electrode. In a preferred embodiment, the metal gate electrode is self-aligned to the source regions after formation of the source regions. The metal gate DMOS transistor has improved gate resistance and lower gate tunnel leakage current than conventional polysilicon gate DMOS transistors. In a further embodiment, the chip area devoted to a gate bus is reduced in favor of additional active cell area, thus increasing the power-handling capability of a given die size without sacrificing switching speed.

The metal gate is self-aligned to the source regions, and a minimal but finite gate-source overlap is provided by the lateral diffusion of the source dopant in conjunction with the self-aligned feature of the gate. The metal gate material typically does not shrink after deposition onto the gate region to the same extent as polysilicon might shrink after deposition, thus fewer active region defects are generated by the metal gate, thus reducing gate leakage current, and improving device performance, lifetime, and reliability. The metal gate layer is formed after the high-temperature processing of the device is complete, particularly the channel and source diffusions.

In one embodiment, chemical-mechanical polishing ("CMP") is used to fabricate a gate metal layer to a selected thickness.

DESCRIPTION OF THE SPECIFIC EMBODIMENTS

The present invention provides a self-aligned metal-gate DMOS FET and methods of manufacture. The metal-gate DMOS FET has lower gate series resistance than conventional DMOS FETs with polysilicon gates. A low drain-source on resistance and a low gate-source capacitance is achieved by the minimal but finite overlap of the gate and source arising from the self-alignment.

Figure 1:
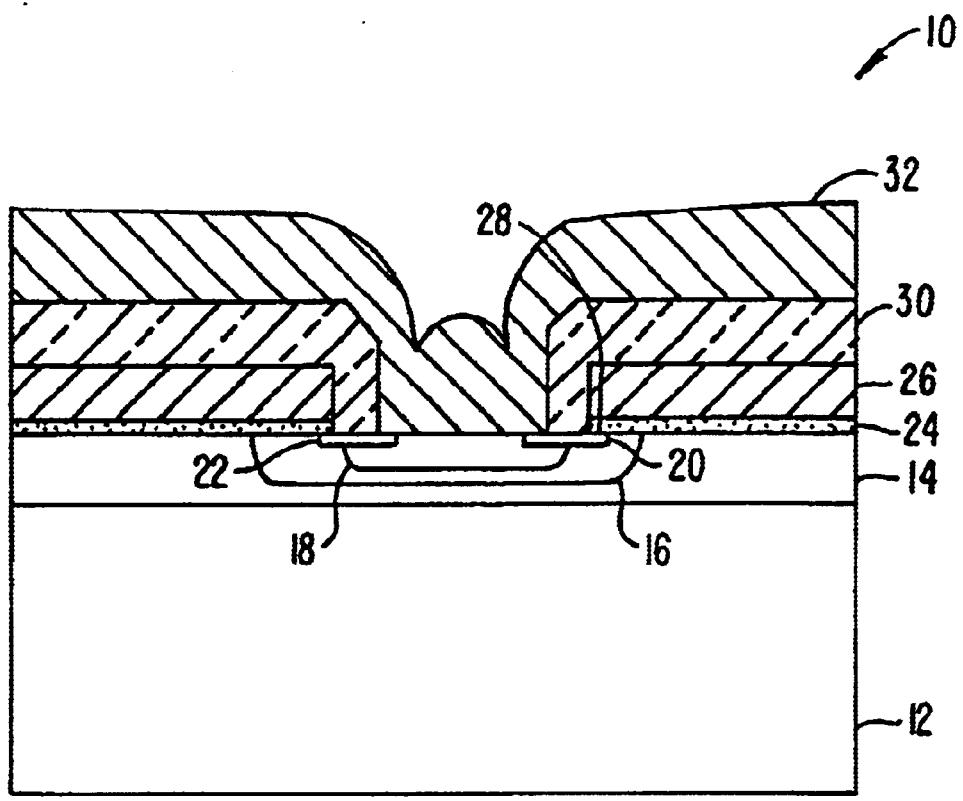
FIG. 1 is a simplified cross section of a portion of a DMOS FET with a self-aligned metal gate according to the present invention.

FIG. 1 is a simplified cross section of a cell of a portion of a DMOS transistor 10 according the present invention. This example illustrates a p-channel device, in which it is especially desirable to use a metal gate instead of a p-type polysilicon gate; however, it is understood that the invention could be applied to an n-channel device. The DMOS transistor is fabricated on a p+ single-crystal silicon substrate 12 that serves as the drain of the DMOS transistor. A p– epitaxial layer 14 has been grown on the substrate. An n– channel region 16 and an n+ heavy body 18 have been formed in the p– epitaxial layer, which will be considered part of the "substrate" for purposes of description, by implanting and diffusion of appropriate dopants. P+ source regions 20, 22 have been implanted and diffused into both the n+ heavy body and n– channel, as well as laterally under the gate. A gate oxide 24 has been grown over the n– channel region 16. A self-aligned metal gate 26 is formed over the gate oxide 24. A small but finite overlap 28 of the source region 20 with the metal gate 26 provides superior turn-on operation with minimal leakage and parasitic capacitance, and is exaggerated for purposes of illustration. A dielectric layer 30 separates the metal gate 26 from the source metallization 32.

Figure 2A:
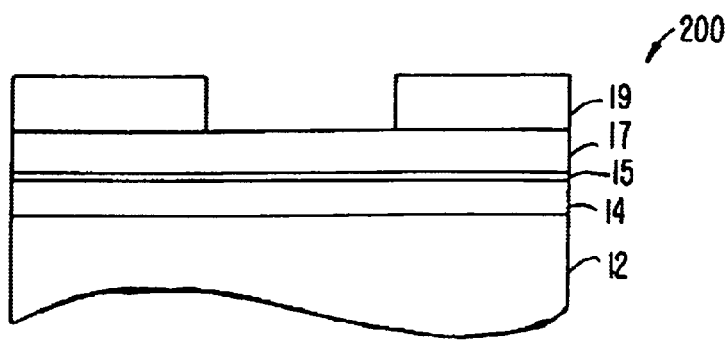
FIGS. 2A to 2M are simplified cross sections of a portion of a substrate being processed into a DMOS device according to the present invention.

FIGS. 2A–2M are simplified cross sections of a portion of a substrate 200 being fabricated to produce a DMOS device. FIG. 2A shows a substrate 12 on which an epitaxial layer 14, pad oxide layer 15, and a silicon nitride layer 17 have been formed. In this instance, a highly doped p-type substrate with resistivity from about 0.001–0.005 ohm-cm will be used to illustrate a p-channel device. The epitaxial layer 14 has a resistivity from about 0.1–5 ohm-cm, and a thickness from about 5 $\mu$m–12 nm, depending on the desired operating voltage. The pad oxide layer 15 may be thermally grown or deposited and is typically about 150–5,000 Å thick, depending on the thickness of the nitride layer, among other factors. The nitride layer is deposited to a thickness of between about 1,000–10,000 Å. The pad oxide and nitride layers are given as examples only, but have the general capacities to withstand subsequent high-temperature processing, serve as an effective ion implantation mask, and be selectively etched or otherwise removed from the substrate. A layer of photo resist 19 has been patterned using conventional techniques to cover selected portions of the nitride layer.

Figure 2B:
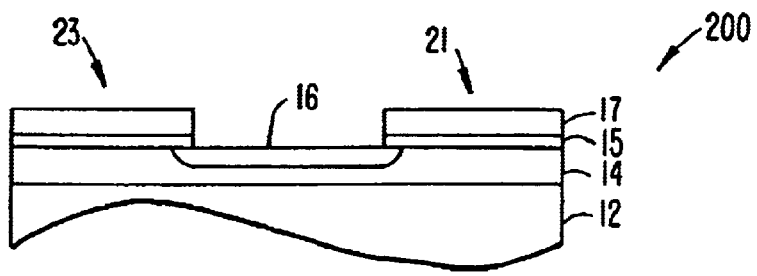

FIG. 2B shows the portion of the substrate 200 after conventional methods have been used to etch the pad oxide and nitride layers to define gate areas 21, 23, and after a channel implant has been performed to form an n– channel region 16. The patterned nitride and pad oxide layers form a sacrificial gate layer that will essentially be removed and replaced with a gate dielectric and gate metal layer. In a preferred embodiment, the patterned photoresist is removed prior to the channel implantation, and the patterned silicon nitride and pad oxide layers are used as the implantation mask. The channel implant dose is adjusted according to the desired threshold voltage required and the resistivity of the epitaxial layer. The implant dose typically ranges from about $1E13–1E14/cm^2$. For a p-channel device, phosphorus, an n-type dopant, is used for the channel implant, and for an n-channel device, boron may be used for the channel implant. After implantation, a thermal treatment is used to drive-in, i.e., activate and diffuse, the implanted dopant. The drive-in temperature and time are adjusted according to the junction depth and the desired threshold voltage. In a specific example, a dose of $1E13–1E14/cm^2$ phosphorous ions was implanted into an epitaxial layer having 150–200 ohm-$cm^2$ and driven in at a temperature of about 1,100° C. for about 60 minutes.

Figure 2C:
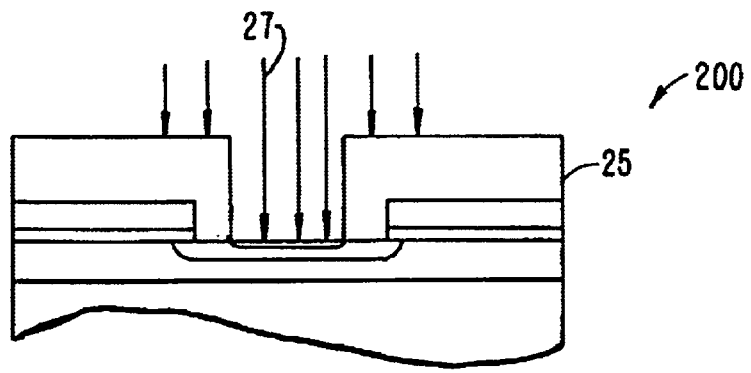
Figure 2D:
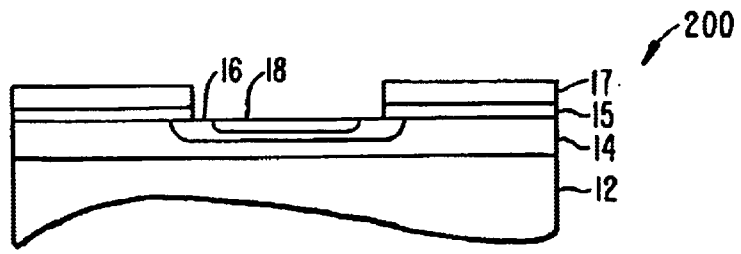

FIG. 2C shows the portion of the substrate 200 after a second layer of photoresist 25 has been patterned to provide a mask for the heavy body implant, represented by arrows 27. The heavy body region 18 provides a highly-doped region that improves ruggedness and grounding of the channel. An example of a heavy body implant is a dose of about $1E15–5E15/cm^2$ of phosphorous. In an alternative process, a separate heavy body masking step is not required, and the heavy body dose is implanted through the source contact openings later in the process flow. FIG. 2D shows the portion of the substrate 200 after the heavy-body mask photoresist has been stripped and the heavy body implant has been thermally treated to drive in the heavy body implant. A typical heavy body drive-in is about 900° C. for about 60 minutes. It is understood that the exact time and temperature depends on many factors, such as desired junction depth, desired operating characteristics of the device, starting materials, device geometry, and so forth. It is further understood that the thermal drive-in of the heavy body also further diffuses the n– channel implant, and that subsequent thermal processing with also further diffuse the implanted species. Alternatively, the heavy body drive-in may be totally or partially combined with other thermal processing steps, such as the source anneal or a rapid thermal anneal.

Figure 2E:
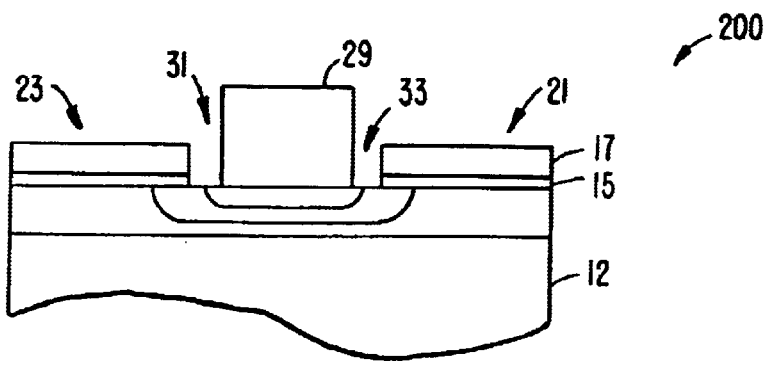
Figure 2F:
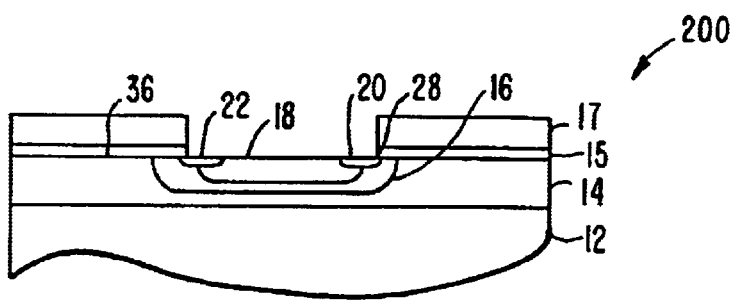

FIG. 2E shows the portion of the substrate 200 with the source mask photoresist layer 29. Source windows 31, 33 are defined by the source mask photoresist in conjunction with the patterned nitride layer 17 and pad oxide layer 15, which define the gate areas 21, 23. FIG. 2F shows the portion of the substrate 200 after the source implant and drive in, and after the source mask photoresist has been stripped, typically prior to the source drive in. The source implant is between about 5E15 and 1E16 of boron for a p– channel device. Phosphorous or arsenic would be appropriate for the source implant of an n– channel device. The source drive-in is about 850° C. for about 60 minutes. The source drive-in diffuses dopant ions from regions of higher concentrations to regions of lower concentrations, hence the drive-in diffuses ions laterally, i.e., parallel to the surface 36 of the epitaxial layer 14, as well as into the depth of the epitaxial layer. The lateral diffusion creates an overlap 28 between the gate area 21 and the source region 20. Thus, not only is the gate self-aligned to the source, but the self-aligned implantation and subsequent drive-in insure an overlap between the gate and the source. This overlap is typically between about 0.1–0.5 $\mu$m, preferably about 0.15 $\mu$m.

Figure 2G:
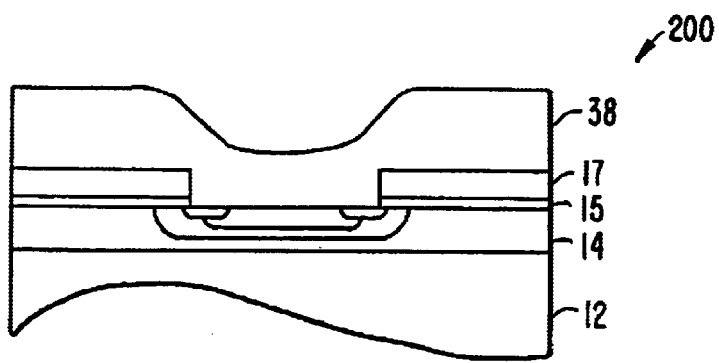
Figure 2H:
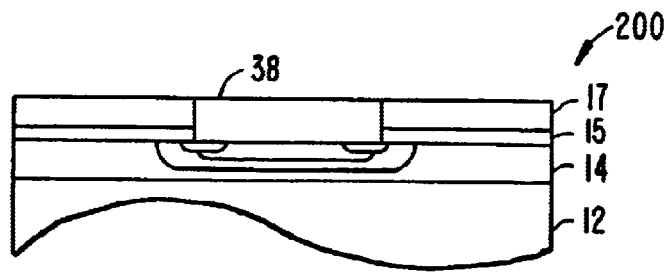

FIG. 2G shows the portion of the substrate 200 after a layer of dielectric material 38 has been deposited. In this instance, a silicon dioxide film has been deposited using a plasma-enhanced chemical-vapor deposition ("PECVD") process, although other processes, such as a spin-on-glass film, may be used. The thickness of the dielectric film is preferably at least as thick as the combination of the pad oxide 15 and silicon nitride 17 layers, although this is not strictly necessary. FIG. 2H shows the portion of the substrate 200 after the dielectric layer 38 has been planarized to the nitride layer 17. It is understood that it is not necessary to planarize the nitride and dielectric layers in some embodiments. In this instance a chemical-mechanical polishing ("CMP") process has been used to remove the dielectric layer to form a contiguous surface with the nitride layer. It is understood that incidental amounts of the nitride layer may be removed, or that substantial amounts of the nitride layer may intentionally be removed if desired, and that other types of planarizing processes, such as a planarizing plasma etch process or a mechanical (abrasive) polishing process can be used.

Figure 2I:
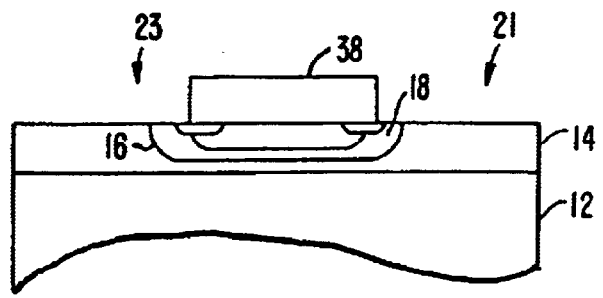
Figure 2J:
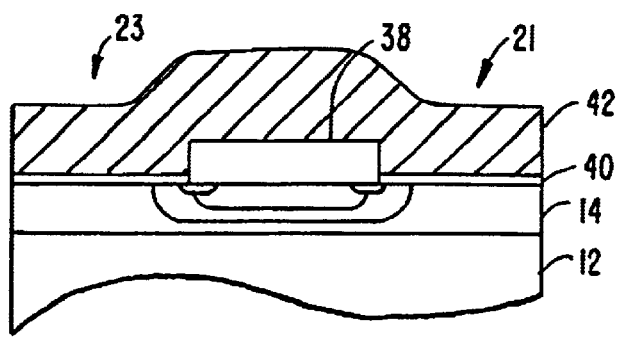
Figure 2K:
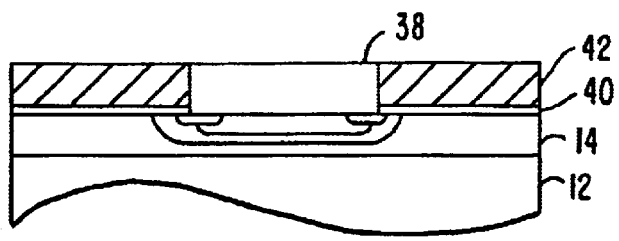

FIG. 2I shows the portion of the substrate after the silicon nitride layer has been stripped, e.g., in a hot phosphoric acid wet etch process, which has good selectivity between the silicon nitride and the silicon oxide dielectric material. The pad oxide has also been stripped. Stripping the pad oxide typically removes an incidental portion of the silicon oxide dielectric layer 38. FIG. 2J shows the portion of the substrate after a gate oxide layer 40 has been grown over the gate regions 21, 23. A gate metal layer 42 has been formed over the gate oxide layer 40 and dielectric layer 38. The gate metal layer can be formed by a variety of processes, including physical vapor deposition (sputtering), evaporation, chemical vapor deposition, plating, or a combination of these or other methods. Typical metals include aluminum-silicon-copper alloy, tungsten, tungsten over titanium nitride, gold over titanium nitride, platinum, and copper, although other metals or combination of metals or metals and barrier/adhesion layers may be used. Such metals are compatible with semiconductor processes and have a lower resistivity than polysilicon when used as a gate conductor. Forming the gate metal layer at this point in the fabrication process, rather than prior to the drive in processes or other high-temperature processes, avoids subjecting the metal to thermal treatments that might reduce device reliability or yield. FIG. 2K shows the portion of the substrate after the gate metal layer 42 has been planarized to the dielectric layer 38. In this instance, a CMP process is used, although other processes may be used, as discussed in conjunction with the FIG. 2H, above. Although it is preferred to stop at the top of the dielectric layer, the substrate may be further polished to thin the gate metal layer.

Figure 2L:
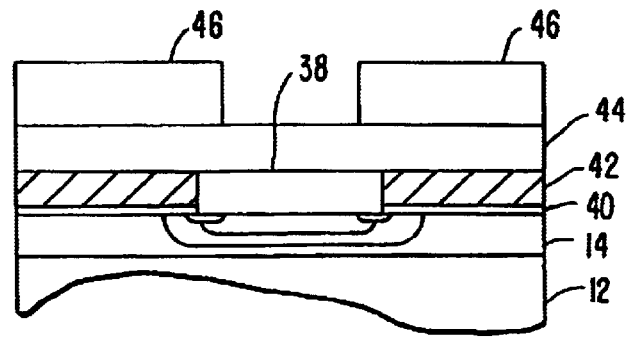

FIG. 2L shows the portion of the substrate after a second dielectric layer 44 has been formed over the gate metal layer 42 and the first dielectric layer 38. The second dielectric layer has been formed using a process that is compatible with the gate metal. For example, low-temperature oxide, i.e., oxide formed below about 400° C., such as using TEOS and ozone, phosphorous-silicon glass, or borophorousphous-silicon glass may be used with an aluminum-silicon-copper gate metal. A source contact mask 46 of photoresist is patterned on the second dielectric layer 44.

Figure 2M:
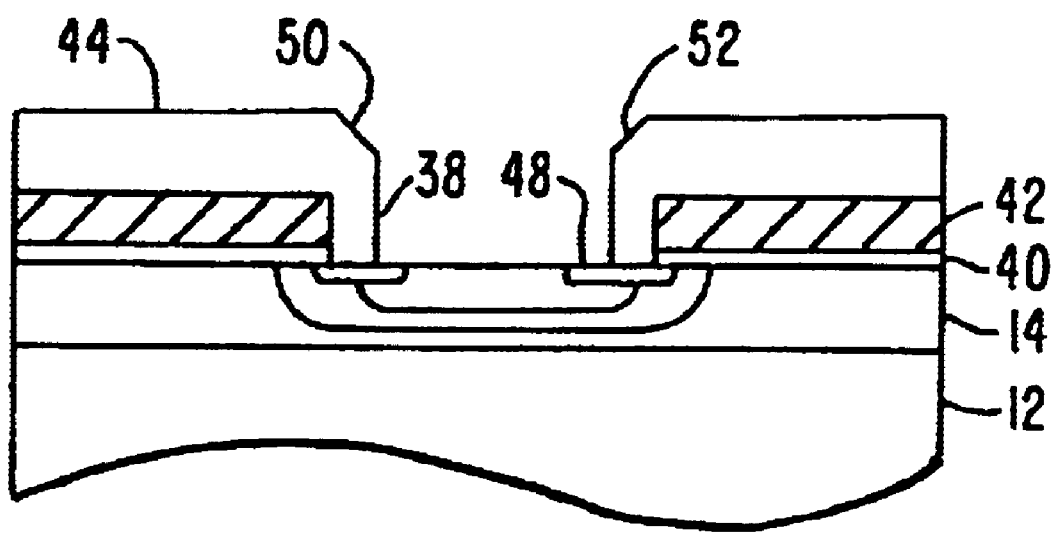

FIG. 2M shows the source contact 48 after etching the first 38 and second 44 dielectric layers. Facets 50, 52 have been formed in the second dielectric layer using a plasma etch technique, as is known in the art, to avoid thinning of the subsequent source metal layer over the facets, as might otherwise occur if a sharp corner existed. An optional rapid thermal anneal at about 800° C. may be performed to activate the implant dose and flow and anneal the dielectric, if necessary. Referring again to FIG. 1, a source metal layer 32 is formed over the substrate. For example, aluminum-silicon-copper is sputtered over the substrate, followed by conventional photomasking and metal etch processes, to result in a DMOS device.

Figure 3A:
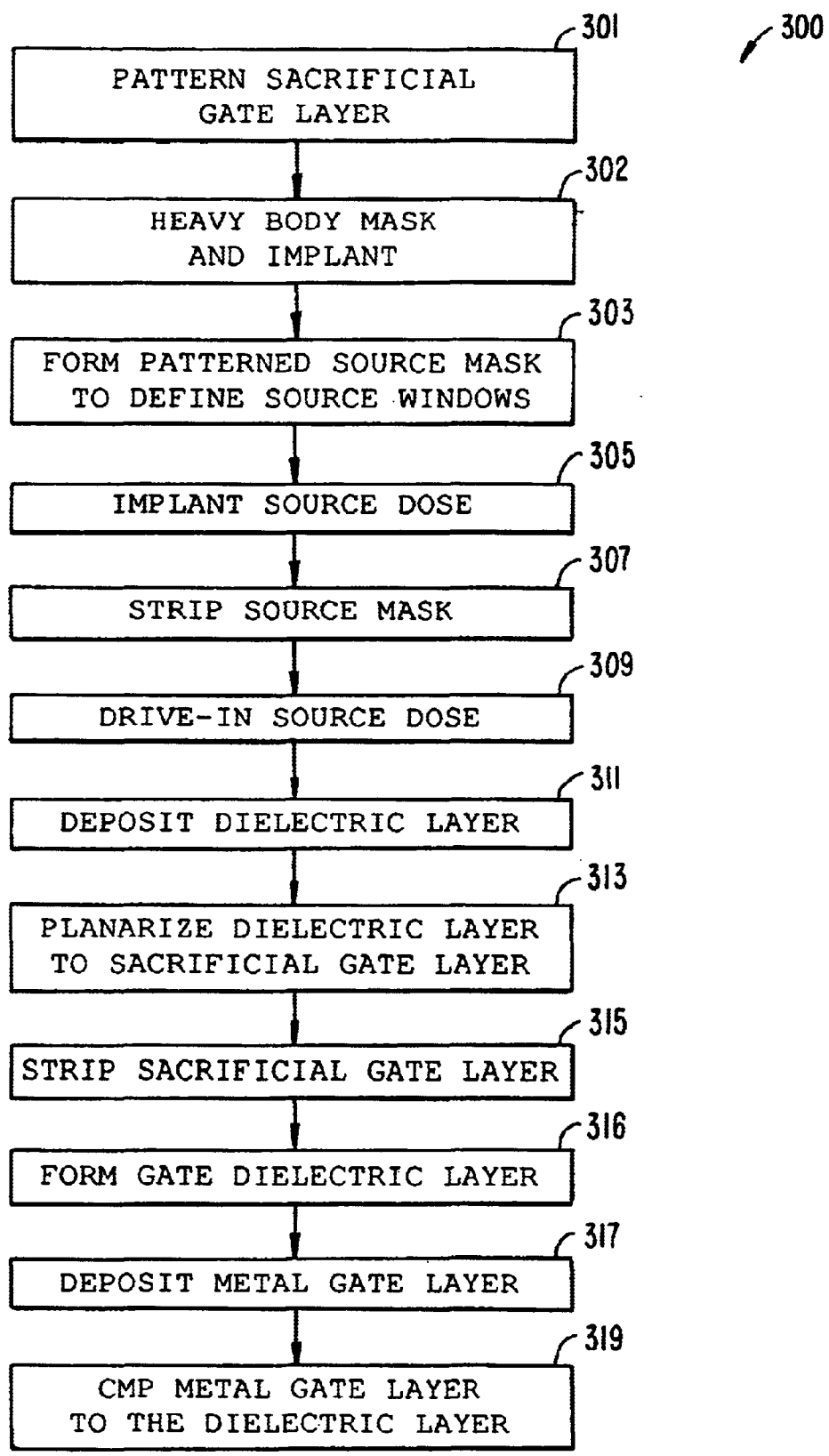
FIG. 3A is a simplified flow chart of a process for fabricating a metal gate for a DMOS substrate.

FIG. 3A is a simplified flow chart of a portion of a process 300 for fabricating a DMOS device with a metal gate. The flow chart focuses on forming the gate metal layer to be self-aligned to source regions with an overlap of the source and gate regions. A DMOS substrate with a sacrificial gate layer is patterned (step 301) and a channel doping is performed (not shown). After forming the channel region, a heavy body mask is patterned and the heavy body is doped (implanted) (step 302). The source contact mask is then patterned (step 303) to form source windows between the source contact mask and the patterned sacrificial gate layer. Source dopants are provided, such as by implantation, to the source windows of the substrate (step 305), and the source mask is stripped (step 307) before the source dose is driven in (step 309) to diffuse the dopant into the substrate and laterally underneath the sacrificial gate layer, and to activate the heavy body implant. A dielectric layer is deposited on the substrate to cover the sacrificial gate layer and the substrate between portions of the sacrificial gate layer (step 311). The dielectric layer is selectively etchable to the sacrificial gate layer. The dielectric layer is planarized with the sacrificial gate layer (step 313), and then sacrificial gate layer is stripped (step 315).

After forming a gate dielectric layer (step 316), a gate metal layer is deposited on the substrate (step 317) and planarized to the dielectric layer (step 319). The substrate is then processed to result in a DMOS device (steps not shown in this figure).

Figure 3B:
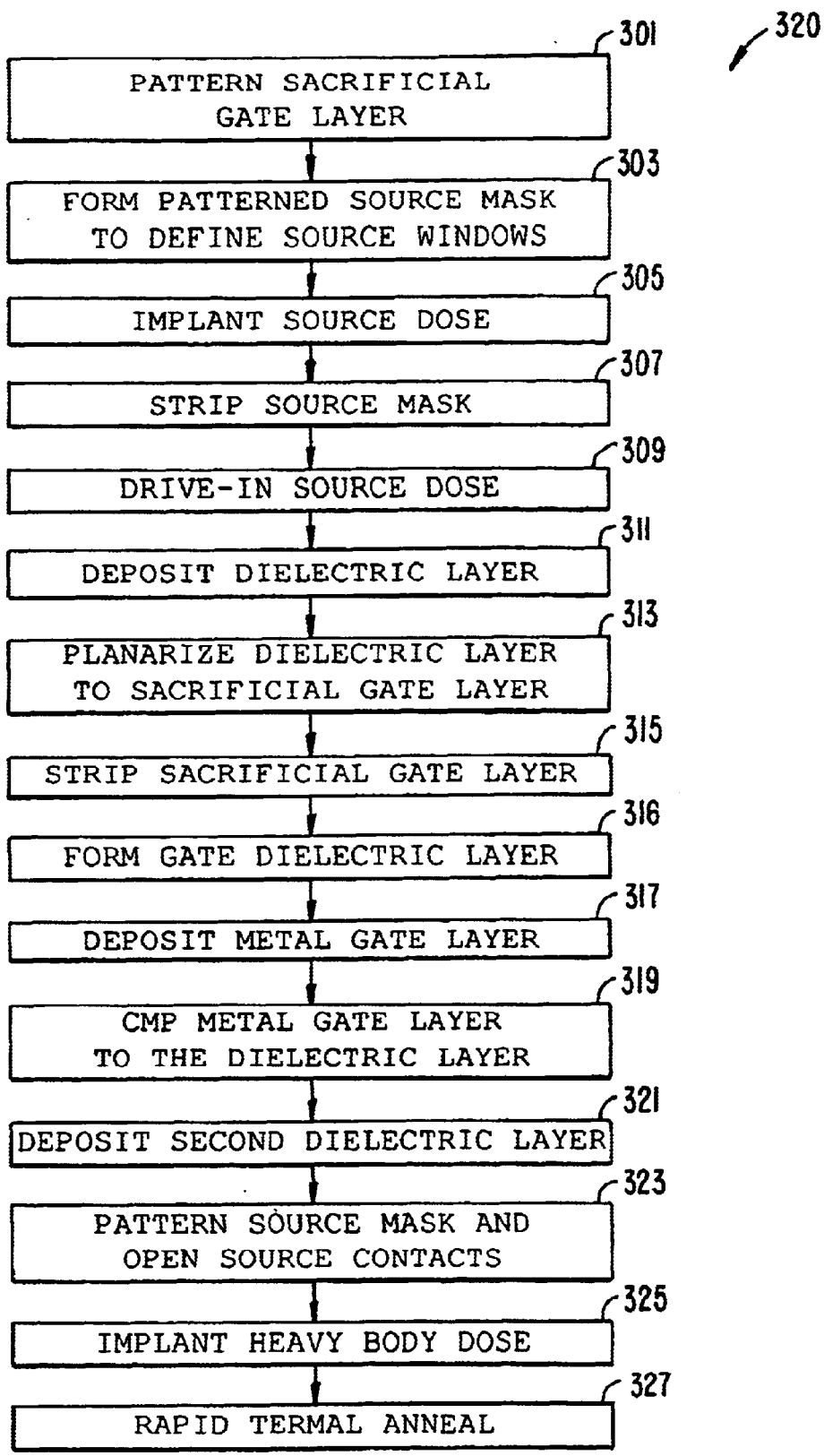
FIG. 3B is a simplified flow chart of a reduced mask step process for fabricating a metal gate for a DMOS.

FIG. 3B is a simplified flow chart of a process 320 according to the present invention with a reduced number of mask steps. A DMOS substrate with a sacrificial gate layer is patterned (step 301) and a channel doping is performed (not shown). A separate heavy body mask step is not performed in this process flow, and the heavy body is not doped at this time. The source contact mask is then patterned (step 303) to form source windows between the source contact mask and the patterned sacrificial gate layer. Source dopants are provided, such as by implantation, to the source windows of the substrate (step 305), and the source mask is stripped (step 307) before the source dose is driven in (step 309) to diffuse the dopant into the substrate and laterally underneath the sacrificial gate layer. A dielectric layer is deposited on the substrate to cover the sacrificial gate layer and the substrate between portions of the sacrificial gate layer (step 311). The dielectric layer is selectively etchable to the sacrificial gate layer. The dielectric layer is planarized with the sacrificial gate layer (step 313), and then sacrificial gate layer is stripped (step 315).

After forming a gate dielectric layer (step 316), a gate metal layer is deposited on the substrate (step 317) and planarized to the dielectric layer (step 319). A second dielectric layer is formed over the gate metal layer and the dielectric layer (step 321), and a source-contact mask is patterned on the second dielectric layer, and the dielectric layers are etched (step 323). Now, the patterned dielectric layers are used as a mask for the heavy body implant (step 325). A rapid thermal anneal (step 327) may be performed to activate the heavy body implant, if necessary.

While the above is a complete description of specific embodiments of the present invention, various modifications, variations, and alternatives may be employed. For example, although a silicon wafer is given as an example of a substrate material, other materials may be used. The invention is illustrated in a cell of a multi-cell DMOS FET with a wide gate, but could be applied to other DMOS structures. Similarly, ion implantation is given as an example of providing dopants to the substrate, but other doping methods, such as a gas or topical dopant source may be used to provide dopants for diffusion, depending on the appropriate mask being used. For example, an oxide mask could be used as an alternative to the photoresist masks described. Such an oxide mask might be a deposited oxide layer patterned using a conventional photoresist method, or might be a UV-developed plasma-polymerized silicon oxide mask. These and other alternatives may appear to those skilled in the art; hence, the scope of this invention should not be limited to the embodiments described, but are instead defined by the following claims.

What is claimed is:

1. A method of fabricating a gate of a semiconductor device comprising:

a) patterning a layer of sacrificial gate material on a substrate;

b) dosing the substrate with a dopant to form a source region self-aligned to the sacrificial gate material;

c) thermally treating the substrate to diffuse a portion of the dopant laterally to form a diffused source region, a portion of the diffused source region underlying a portion of the layer of sacrificial gate material; then d) forming a dielectric layer on the substrate;

e) removing a portion of the dielectric layer to expose the layer of sacrificial gate material;

f) stripping the sacrificial gate material from the substrate to form a gate region;

g) forming a gate dielectric layer in the gate region; and h) forming a metal gate layer on the gate dielectric layer wherein at least a portion of the metal gate layer occupies a volume previously occupied by the sacrificial gate layer.

2. The method of claim 1 further comprising:

i) planarizing the metal gate layer and the dielectric layer.

3. The method of claim 2 wherein the planarizing step comprises chemical-mechanical polishing.

4. The method of claim 1 wherein the removing step comprises chemical-mechanical polishing to planarize the dielectric layer with the layer of sacrificial gate material.

5. The method of claim 1 wherein the sacrificial gate material comprises silicon nitride, the substrate comprises silicon, and the dielectric layer comprises a silicon oxide.

6. The method of claim 1 wherein the forming of the metal gate layer comprises sputtering aluminum-silicon-copper alloy.

7. A method of fabricating a gate of a semiconductor device comprising:

a) patterning a layer of silicon nitride on a silicon substrate;

b) dosing the silicon substrate with a dopant to form a source region self-aligned to the silicon nitride;

c) thermally treating the silicon substrate to diffuse a portion of the dopant laterally to form a diffused source region, a portion of the diffused source region underlying a portion of the layer of silicon nitride; then d) forming a silicon oxide layer on the substrate;

e) planarizing the silicon oxide layer with the silicon nitride layer using a chemical-mechanical polishing technique to expose the silicon nitride layer;

f) stripping the silicon nitride layer from the silicon substrate to form a gate region;

g) forming a gate dielectric layer on the substrate in the gate region;

h) sputtering aluminum-silicon-copper alloy to form a metal gate layer on at least the gate dielectric layer wherein a portion of the metal gate layer fills a volume previously filled by the silicon nitride; and i) planarizing the metal gate layer with the silicon oxide layer using a chemical-mechanical polishing technique.

8. A method comprising:

a) forming a sacrificial gate structure of a device on a substrate, the gate structure having a first gate sacrificial gate portion and a second sacrificial gate portion, the first gate portion being separated from the second gate portion by a first window region;

b) depositing a photoresist layer over the gate structure and the first window region;

c) opening a second window region in the photoresist layer within the first window region between the first gate portion and the second gate portion;

d) implanting a dose through the second window region into the substrate to form a heavily doped body;

e) removing the photoresist layer after d);

f) removing the sacrificial gate structure from the substrate; and g) forming a gate layer wherein at least a portion of the gate layer occupies a volume previously occupied by the sacrificial gate structure.

9. The method of claim 8 wherein the sacrificial gate structure comprises a pad oxide layer and a patterned nitride layer.

10. The method of claim 8 wherein forming the gate layer comprises sputtering.

* * * * *